(12) United States Patent
Yoon et al.

(10) Patent No.: US 8,735,029 B2
(45) Date of Patent: May 27, 2014

(54) POSITIVE PHOTOSENSITIVE RESIN COMPOSITION, AND DISPLAY DEVICE AND ORGANIC LIGHT EMITTING DEVICE USING THE SAME

(75) Inventors: Eun-Kyung Yoon, Uiwang-si (KR); Eun-Ha Hwang, Uiwang-si (KR); Jong-Hwa Lee, Uiwang-si (KR); Ji-Yun Kwon, Uiwang-si (KR); Dae-Yun Kim, Uiwang-si (KR); Sang-Kyeon Kim, Uiwang-si (KR); Sang-Kyun Kim, Uiwang-si (KR); Sang-Soo Kim, Uiwang-si (KR); Kun-Bae Noh, Uiwang-si (KR); Jun-Ho Lee, Uiwang-si (KR); Jin-Young Lee, Uiwang-si (KR); Hyun-Yong Cho, Uiwang-si (KR); Chung-Beom Hong, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 16 days.

(21) Appl. No.: 13/603,491

(22) Filed: Sep. 5, 2012

(65) Prior Publication Data
US 2013/0171564 A1    Jul. 4, 2013

(30) Foreign Application Priority Data
Dec. 30, 2011  (KR) .......................... 10-2011-0147383

(51) Int. Cl.
G03F 7/023    (2006.01)
G03F 7/022    (2006.01)

(52) U.S. Cl.
CPC ............ *G03F 7/0226* (2013.01); *G03F 7/0233* (2013.01); *Y10S 430/107* (2013.01)
USPC ............. 430/18; 430/191; 430/192; 430/193; 430/906

(58) Field of Classification Search
CPC ............................ G03F 7/0226; G03F 7/0233
USPC .................... 430/18, 165, 191, 192, 193, 906
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore | |
| 3,669,658 A | 6/1972 | Yonezawa et al. | |
| 5,529,882 A * | 6/1996 | Takezoe et al. | 430/192 |
| 5,609,914 A | 3/1997 | Ma et al. | |
| 5,916,728 A | 6/1999 | Fukui et al. | |
| 6,797,450 B2 * | 9/2004 | Suzuki et al. | 430/166 |
| 7,368,205 B2 | 5/2008 | Banba et al. | |
| 2003/0054284 A1 * | 3/2003 | Suzuki et al. | 430/192 |
| 2003/0059715 A1 * | 3/2003 | Sato | 430/287.1 |
| 2009/0197067 A1 * | 8/2009 | Naiini et al. | 428/220 |
| 2011/0099744 A1 | 5/2011 | Sterkl et al. | |
| 2011/0157275 A1 | 6/2011 | Kubota | |

FOREIGN PATENT DOCUMENTS

| | | |
|---|---|---|
| EP | 0742487 A1 | 11/1996 |
| JP | 2010-235863 A | 10/2010 |
| KR | 10-1998-0032828 A | 7/1998 |
| KR | 10-2005-0016162 A | 2/2005 |
| KR | 10-2010-0077669 A | 7/2010 |
| KR | 10-2010-0080144 A | 7/2010 |
| KR | 10-2011-0009211 A | 1/2011 |
| KR | 10-2011-0074692 A | 7/2011 |
| KR | 10-2011-0075691 A | 7/2011 |
| KR | 10-2011-0075692 A | 7/2011 |
| KR | 10-2011-0089211 A | 8/2011 |

OTHER PUBLICATIONS

Search Report in counterpart Taiwanese Application No. 101133142 dated Mar. 13, 2014, pp. 1.

* cited by examiner

*Primary Examiner* — John Chu
(74) *Attorney, Agent, or Firm* — Additon, Higgins, Pendleton & Ashe, P.A.

(57) ABSTRACT

Disclosed are a positive photosensitive resin composition including (A) an alkali soluble resin including a polybenzoxazole precursor, a polyimide precursor, or a combination thereof, (B) a photosensitive diazoquinone compound, (C) a compound represented by the following Chemical Formula 1, and (D) a solvent, and a display device and an organic light emitting device using the same.

[Chemical Formula 1]

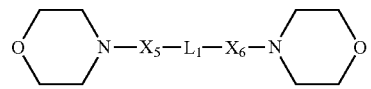

The Chemical Formula 1 is the same as defined in the detailed description.

9 Claims, 1 Drawing Sheet

| | Ag adherence test (after allowed to stand at a room temperature) | Ag adherence test (after allowed to stand for 168 hours under 85/85) |
|---|---|---|
| Example 1 | | |
| Example 2 | | |
| Example 3 | | |
| Example 4 | | |
| Example 5 | | |
| Example 6 | | |
| Example 7 | | |
| Example 8 | | |
| Example 9 | | |
| Example 10 | | |
| Example 11 | | |
| Example 12 | | |
| Comparative Example 1 | | |
| Comparative Example 2 | | |
| Comparative Example 3 | | |
| Comparative Example 4 | | |

POSITIVE PHOTOSENSITIVE RESIN COMPOSITION, AND DISPLAY DEVICE AND ORGANIC LIGHT EMITTING DEVICE USING THE SAME

CROSS-REFERENCE TO RELATED APPLICATIONS

This application claims priority to and the benefit of Korean Patent Application No. 10-2011-0147383 filed in the Korean Intellectual Property Office on Dec. 30, 2011, the entire disclosure of which is incorporated herein by reference.

FIELD

This disclosure relates to a positive photosensitive resin composition and a display device and an organic light emitting device using the same.

BACKGROUND

A photosensitive polyimide and polybenzoxazole resin can have excellent thermal mechanical characteristics and can be used in a semiconductor protective layer, an interlayer insulating layer and the like, in various applications, including display fields. For example, a photosensitive polyimide and polybenzoxazole resin can have heat resistance, low dielectric constant, and insulation properties and can be used in a display device as an insulation layer and as an electrode protective layer of an organic electro-luminescence device. The photosensitive polyimide and polybenzoxazole may be used as an insulation layer of an organic light emitting device and can provide a smooth coating surface, low impurities, which can deteriorate device reliability, and facilitate the formation of a fine shape.

However, a display device such as an organic electro-luminescence device requires an insulation layer with improved reliability and the ability to form a desired shape, which can be produced using simplified manufacturing processes. In addition, with the downsizing of device sizes and increased semiconductor device integration, the positive photosensitive resin composition is required to have excellent adherence with various metal layers and also excellent adherence with a substrate after the wafer process.

To improve adherence with a substrate, a positive photosensitive resin composition can include a coupling agent of a silane compound to prevent metal delamination caused by etching. The adhesive improvement, however, can be limited due to low compatibility of a silane compound.

SUMMARY

One embodiment provides a positive photosensitive resin composition which can improve adherence between a lower substrate and a photosensitive resin film and can suppress delamination of a metal layer deposited on the film.

Another embodiment provides a display device using the positive photosensitive resin composition.

Yet another embodiment provides an organic light emitting device using the positive photosensitive resin composition.

According to one embodiment, provided is a positive photosensitive resin composition that includes (A) an alkali soluble resin including a polybenzoxazole precursor, a polyimide precursor, or a combination thereof, (B) a photosensitive diazoquinone compound, (C) a compound represented by the following Chemical Formula 1, and (D) a solvent.

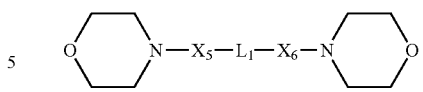

[Chemical Formula 1]

In Chemical Formula 1, $X_5$ and $X_6$ are the same or different and are each independently —S—, —C(=O)—, —C(=S)—, substituted or unsubstituted C1 to C30 alkylene, substituted or unsubstituted C6 to C30 cycloalkylene, or substituted or unsubstituted C6 to C30 cycloallylene, and $L_1$ is a single bond, a disulfide bond (—S—S—), —S(=O)—, —C(=O)—, or —C(=S)—.

The polybenzoxazole precursor may include a repeating unit represented by the following Chemical Formula 2 or repeating units represented by the following Chemical Formulae 2 and 3

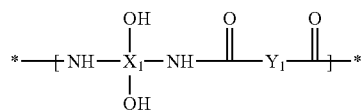

[Chemical Formula 2]

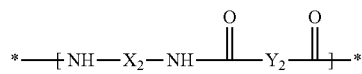

[Chemical Formula 3]

In Chemical Formulae 2 and 3, $X_1$ is an aromatic organic group or tetravalent to hexavalent aliphatic organic group, $Y_1$ and $Y_2$ are the same or different and are each independently an aromatic organic group or divalent to hexavalent aliphatic organic group, and $X_2$ is an aromatic organic group, divalent to hexavalent aliphatic organic group, divalent to hexavalent alicyclic organic group, or an organic group represented by the following Chemical Formula 4,

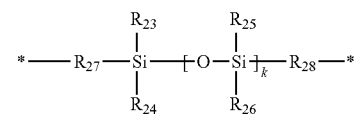

[Chemical Formula 4]

In Chemical Formula 4, $R_{23}$ to $R_{26}$ are the same or different and are each independently substituted or unsubstituted alkyl, substituted or unsubstituted aryl, substituted or unsubstituted alkoxy, or hydroxy, $R_{27}$ and $R_{28}$ are the same or different and are each independently substituted or unsubstituted alkylene or substituted or unsubstituted arylene, and k is an integer ranging from 1 to 50.

The polyimide precursor may include repeating units represented by the following Chemical Formula 50 and the following Chemical Formula 51.

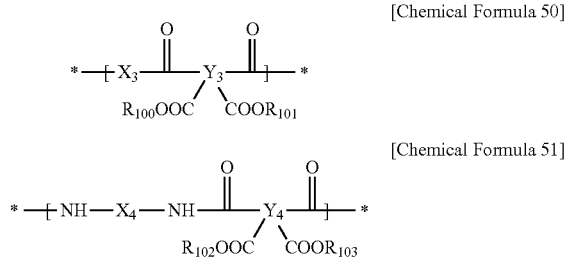

[Chemical Formula 50]

[Chemical Formula 51]

In Chemical Formulae 50 and 51, $X_3$ is an aromatic organic group or divalent to hexavalent alicyclic organic group, $Y_3$ and $Y_4$ are the same or different and are each independently an aromatic organic group or tetravalent to hexavalent alicyclic organic group, $X_4$ is an aromatic organic group, divalent to hexavalent alicyclic organic group, or a functional group represented by the above Chemical Formula 3, and $R_{100}$ to $R_{103}$ are the same or different and are each independently hydrogen or substituted or unsubstituted C1 to C20 alkyl.

The compound represented by the above Chemical Formula 1 may include one of compounds represented by the following Chemical Formulae 5 to 7, or a combination thereof.

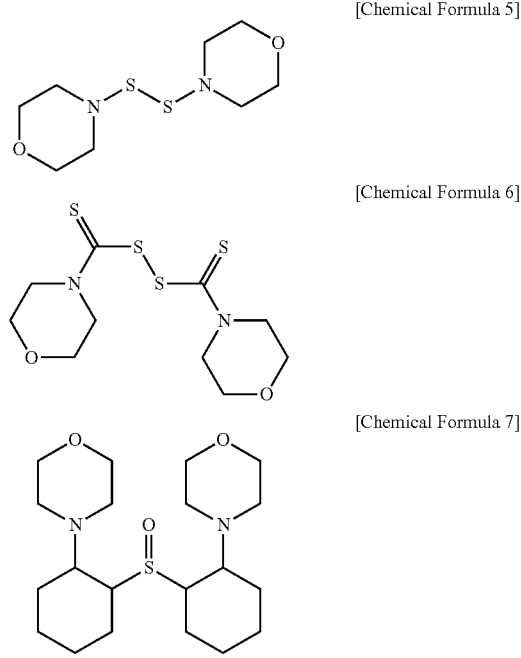

[Chemical Formula 5]

[Chemical Formula 6]

[Chemical Formula 7]

The positive photosensitive resin composition may further include a silane compound.

The positive photosensitive resin composition may further include a novolac resin including a repeating unit represented by the following Chemical Formula 8.

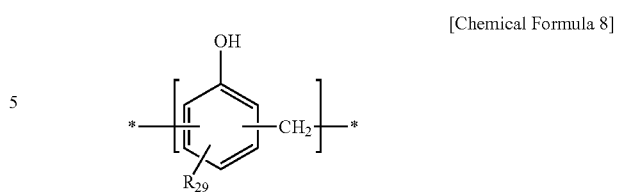

[Chemical Formula 8]

In Chemical Formula 8, each $R^{29}$ is the same or different in each repeating unit and is each independently a substituted or unsubstituted C1 to C20 aliphatic organic group, wherein about 50 mol % or more of $R^{29}$ may be positioned at a meta position based on a position of a hydroxy group (OH), based on the total amount of $R^{29}$ of repeating units of the novolac resin.

The positive photosensitive resin composition may include about 5 to about 100 parts by weight of a photosensitive diazoquinone compound (B), about 0.1 to about 10 parts by weight of the compound represented by the above Chemical Formula 1 (C), and about 100 to about 400 parts by weight of the solvent (D), based on about 100 parts by weight of the alkali soluble resin (A).

According to another embodiment, a display device including an insulation layer prepared using the positive photosensitive resin composition is provided.

According to a further embodiment, an organic light emitting device using the positive photosensitive resin composition is provided.

According to one embodiment, the positive photosensitive resin composition may provide an insulation layer that can have significantly improved adherence with a substrate and a display device using the same.

BRIEF DESCRIPTION OF THE DRAWING

FIG. 1 shows the results of silver (Ag) deposit and delaminating tests according to Examples 1 to 12 and Comparative Examples 1 to 4.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C30 alkyl, the term "alkoxy" refers to C1 to C30 alkoxy, for example C1 to C18 alkoxy, the term "aryl" refers to C6 to C30 aryl, the term "arylalkyl" refers to C7 to C30 arylalkyl, the term "alkylene" refers to C1 to C20 alkylene, the term "arylene" refers to C6 to C30 arylene, and the term "alkoxylene" refers to C1 to C20 alkoxylene.

As used herein, when a specific definition is not otherwise provided, the term "substituted" refers to one substituted with at least a substituent including halogen (F, Cl, Br, or I), a hydroxy group, a nitro group, a cyano group, an imino group (=NH, =NR, wherein R is C1 to C10 alkyl), an amino group (—NH$_2$, —NH(R'), —N(R")(R'"), wherein R' to R'" are the same or different and are each independently C1 to C10 alkyl), an amidino group, a hydrazine group, a hydrazone group, a carboxyl group, substituted or unsubstituted C1 to C30 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination therein, in place of at least one hydrogen of a functional group.

As used herein, when a definition is not otherwise provided, the term "hetero" may refer to one including a heteroatom including N, O, S, P or a combination thereof in place of a carbon atom in a ring.

As used herein, when a definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, a C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" may refer to C6 to C30 aryl or C6 to C30 arylene, for example C6 to C16 aryl or C6 to C16 arylene.

Also, "*" refers to a linking part between the same or different atoms, or Chemical Formulae.

As used herein, when a definition is not otherwise provided, the term "combination thereof" refers to at least two substituents bound to each other by a linker, or at least two substituents condensed to each other.

The adherence between the substrate and the photosensitive resin layer can be improved by using a coupling agent based on a dimorpholine compound, which can help solve problems associated with the production of defective products of a display device.

According to one embodiment, a positive photosensitive resin composition includes (A) an alkali soluble resin including a polybenzoxazole precursor, a polyimide precursor, or a combination thereof, (B) a photosensitive diazoquinone compound, (C) a compound represented by the following Chemical Formula 1, and (D) a solvent.

[Chemical Formula 1]

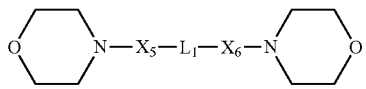

In Chemical Formula 1, $X_5$ and $X_6$ are the same or different and are each independently —S—, —C(=O)—, —C(=S)—, substituted or unsubstituted C1 to C30 alkylene, substituted or unsubstituted C6 to C30 cycloalkylene, or substituted or unsubstituted C6 to C30 arylene, and $L_1$ is a single bond, a disulfide bond (—S—S—), —S(=O)—, —C(=O)—, or —C(=S)—.

Hereinafter, exemplary embodiments will hereinafter be described in detail.

However, these embodiments are only exemplary, and the present invention is not limited thereto.

(A) Alkali Soluble Resin

The alkali soluble resin may include a polybenzoxazole precursor, a polyimide precursor, or a combination thereof.

The polybenzoxazole precursor may include a repeating unit represented by the following Chemical Formula 2, or repeating units represented by the following Chemical Formulae 2 and 3.

[Chemical Formula 2]

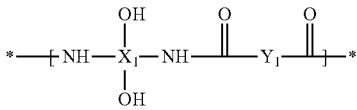

[Chemical Formula 3]

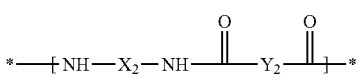

In Chemical Formulae 2 and 3, $X_1$ is an aromatic organic group or tetravalent to hexavalent aliphatic organic group, $Y_1$ and $Y_2$ are the same or different and are each independently an aromatic organic group or divalent to hexavalent aliphatic organic group, and $X_2$ is an aromatic organic group, divalent to hexavalent aliphatic organic group, divalent to hexavalent alicyclic organic group, or an organic group represented by the following Chemical Formula 4.

[Chemical Formula 4]

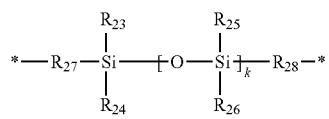

In Chemical Formula 4, $R_{23}$ to $R_{26}$ are the same or different and are each independently substituted or unsubstituted alkyl, substituted or unsubstituted aryl, substituted or unsubstituted alkoxy, or hydroxy, $R_{27}$ and $R_{28}$ are the same or different and are each independently substituted or unsubstituted alkylene or substituted or unsubstituted arylene, and k is an integer ranging from 1 to 50.

The polybenzoxazole precursor is not limited to a specific form, and may be a random, block, or alternating copolymer.

When the polybenzoxazole precursor includes both repeating units represented by Chemical Formulae 2 and 3, the repeating unit represented by Chemical Formula 2 may be included at an amount of more than or equal to about 60 mol % and less than about 100 mol %.

Examples of $X_1$ may include without limitation a residual group derived from 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis (4-amino-3-hydroxyphenyl)-1,1,1,3,3,3-hexafluoropropane, 2,2'-bis (3-amino-4-hydroxy-5-trifluoromethylphenyl)hexafluoropropane, 2,2'-bis (3-amino-4-hydroxy-6-trifluoromethylphenyl)hexafluoropropane, 2,2'-bis (3-amino-4-hydroxy-2-trifluoromethylphenyl)hexafluoropropane, 2,2'-bis (4-amino-3-hydroxy-5-trifluoromethylphenyl)hexafluoropropane, 2,2'-bis (4-amino-3-hydroxy-6-trifluoromethylphenyl) hexafluoropropane, 2,2'-bis (4-amino-3-hydroxy-2-trifluoromethylphenyl)hexafluoropropane, 2,2'-bis (3-amino-4-hydroxy-5-pentafluoroethylphenyl)hexafluoropropane, 2-(3-amino-4-hydroxy-5-trifluoromethylphenyl)-2'-(3-amino-4- hydroxy-5-pentafluoroethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, 2-(3-amino-4-hydroxy-6-trifluoromethylphenyl)-2'-(3-hydroxy-4-amino-5-trifluoromethylphenyl)hexafluoropropane, and the like, and combinations thereof.

$X_1$ may be a functional group represented by the following Chemical Formula 9, Chemical Formula 10 or a combination thereof.

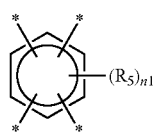

[Chemical Formula 9]

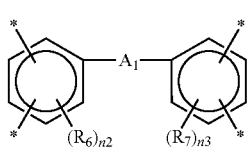

[Chemical Formula 10]

In Chemical Formulae 9 and 10,
$A_1$ is O, CO, $CR_8R_9$, $SO_2$, S, or a single bond,
$R_5$ to $R_7$ are the same or different and are each independently hydrogen, substituted or unsubstituted alkyl, a hydroxy group, a carboxylic acid group, or a thiol group,
$n_1$ is an integer of 1 to 2, and
$n_2$ and $n_3$ are the same or different and are each independently an integer of 1 to 3.

$X_2$ may be derived from aromatic diamine, alicyclic diamine, or silicon diamine.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, and the like, and combinations thereof. The aromatic diamine may be used singularly or as a mixture thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of the alicyclic diamine may include without limitation cyclohexyldiamine, methylenebiscyclohexylamine, and the like, and combinations thereof.

The aromatic diamine, silicon diamine, and/or alicyclic diamine may be mixed in an appropriate ratio.

$Y_1$ and $Y_2$ may be a residual group derived from a dicarboxylic acid or a residual group derived from a dicarboxylic acid derivative.

Examples of the dicarboxylic acid include without limitation $Y(COOH)_2$ (wherein Y is the same as $Y_1$ and $Y_2$).

Examples of the dicarboxylic acid derivative include without limitation carbonyl halide derivatives or active compounds of an active ester derivative obtained by reacting $Y(COOH)_2$ with 1-hydroxy-1,2,3-benzotriazole. Examples of the dicarboxylic acid derivative include without limitation 4,4'-oxydibenzoylchloride, diphenyloxydicarboxylic acid chloride, bis(phenylcarboxylic acid chloride)sulfone, bis(phenylcarboxylic acid chloride)ether, bis(phenylcarboxylic acid chloride)phenone, phthalic carboxylic acid dichloride, terephthalic acid dichloride, isophthalic carboxylic acid dichloride, carboxylic acid dichloride, diphenyloxydicarboxylate benzotriazole and the like, and combinations thereof.

$Y_1$ and $Y_2$ may be functional groups represented by one of the following Chemical Formulae 11 to 13, or a combination thereof.

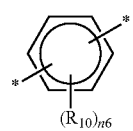

[Chemical Formula 11]

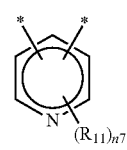

[Chemical Formula 12]

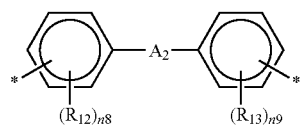

[Chemical Formula 13]

In Chemical Formulae 11 to 13,
$R_{10}$ to $R_{13}$ are the same or different and are each independently hydrogen or substituted or unsubstituted alkyl,
$n_6$, $n_8$, and $n_9$ are the same or different and are each independently an integer of 1 to 4,
$n_7$ is an integer of 1 to 3, and
$A_2$ is O, $CR_{14}R_{15}$, CO, CONH, S, or $SO_2$, wherein $R_{14}$ and $R_{15}$ are the same or different and are each independently hydrogen, substituted or unsubstituted alkyl, or fluoroalkyl.

The polybenzoxazole precursor may include a thermally polymerizable functional group derived from a reactive end-capping monomer at at least one terminal end of branched chain of the polybenzoxazole precursor.

Examples of the reactive end-capping monomer may include without limitation monoamines including double bonds, monoanhydrides including double bonds, and the like, and combinations thereof.

Examples of the monoamines including double bonds may include without limitation toluidine, dimethylaniline, ethylaniline, aminophenol, aminobenzyl alcohol, aminoindan, aminoacetophenone, and the like, and combinations thereof.

Examples of the monoanhydrides including the double bond may include without limitation 5-norbornene-2,3-dicarboxylanhydride represented by the following Chemical Formula 14, 3,6-epoxy-1,2,3,6-tetrahydrophthalic anhydride represented by the following Chemical Formula 15, isobutenyl succinic anhydride represented by the following Chemical Formula 16, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 14]

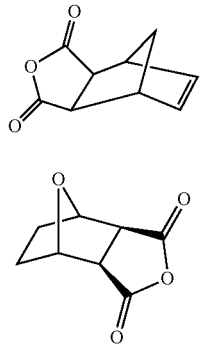

[Chemical Formula 15]

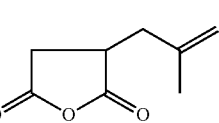

[Chemical Formula 16]

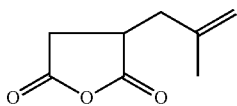

The following Chemical Formulae 17 to 21 are examples of the thermally polymerizable functional group that can be positioned at the terminal end of the polybenzoxazole precursor. The thermally polymerizable functional group may be cross-linked during heating process of the polybenzoxazole precursor preparation process.

[Chemical Formula 17]

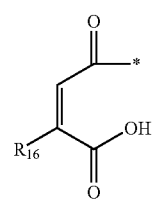

In Chemical Formula 17, $R_{16}$ is H, $CH_2COOH$, or $CH_2CHCHCH_3$.

[Chemical Formula 18]

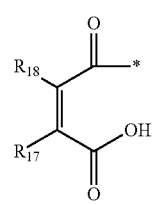

In Chemical Formula 18, $R_{17}$ and $R_{18}$ are the same or different and are each independently H or $CH_3$.

[Chemical Formula 19]

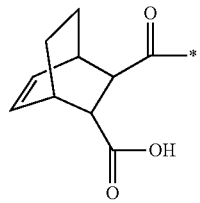

[Chemical Formula 20]

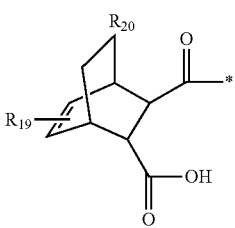

In Chemical Formula 20, $R_{19}$ is H or $CH_3$, and $R_{20}$ is $CH_2$ or oxygen.

[Chemical Formula 21]

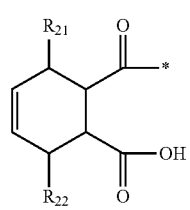

In Chemical Formula 21, $R_{21}$ and $R_{22}$ are the same or different and are each independently H, $CH_3$, or $OCOCH_3$.

The polybenzoxazole precursor can have a weight average molecular weight (Mw) ranging from about 3,000 to about 300,000. When the polybenzoxazole precursor has a weight average molecular weight within the above range, sufficient physical properties and excellent solubility to the organic solvent may be provided.

The polyimide precursor may further include repeating units represented by the following Chemical Formulae 50 and 51. The repeating unit represented by following Chemical Formula 50 can enable rapid resin curing at a high temperature, and the repeating unit represented by the following Chemical Formula 51 can improve thermal properties when being cured at a high temperature.

[Chemical Formula 50]

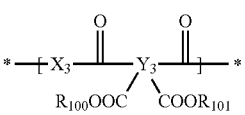

[Chemical Formula 51]

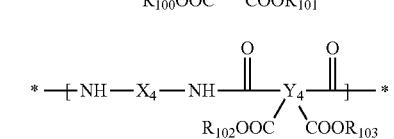

In Chemical Formulae 50 to 51, $X_3$ is an aromatic organic group or divalent to hexavalent alicyclic organic group, $Y_3$ and $Y_4$ are the same or different and are each independently an aromatic organic group or tetravalent to hexavalent alicyclic organic group, $X_4$ is an aromatic organic group, divalent to hexavalent alicyclic organic group, or a functional group represented by the above Chemical Formula 4, and $R_{100}$ to $R_{103}$ are the same or different and are each independently hydrogen or substituted or unsubstituted C1 to C20 alkyl.

In the positive photosensitive resin composition, based on the sum (that is, based on 100 mol %) of the repeating unit represented by the above Chemical Formula 50 and the repeating unit represented by the above Chemical Formula 51, the repeating unit represented by the above Chemical Formula 50 and the repeating unit represented by the above Chemical Formula 51 may be included in an amount of about 5 mol % to about 50 mol % and about 50 mol % to about 95 mol %, respectively.

The polyimide precursor may have a weight average molecular weight (Mw) of about 3,000 to about 300,000.

(B) Photosensitive diazoquinone compound

The photosensitive diazoquinone compound may be a compound including a 1,2-benzoquinone diazide or 1,2-naphtoquinone diazide structure. Exemplary photosensitive diazoquinone compounds are disclosed in U.S. Pat. Nos. 2,772,975, 2,797,213, and 3,669,658, which are incorporated herein by reference in their entirety.

The photosensitive diazoquinone compound may include at least one compound represented by the following Chemical Formula 22, Chemical Formulae 24 to 26, or a combination thereof, but is not limited thereto.

[Chemical Formula 22]

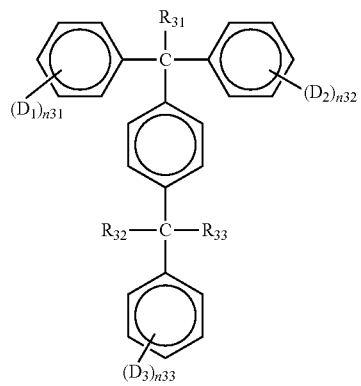

In Chemical Formula 22, $R_{31}$ to $R_{33}$ are the same or different and are each independently, hydrogen or substituted or unsubstituted alkyl, for example $CH_3$, $D_1$ to $D_3$ are the same or different and are each independently OQ, wherein Q is hydrogen or the following Chemical Formula 23a or 23b, provided that not all Qs are simultaneously hydrogen, and $n_{31}$ to $n_{33}$ are the same or different and are each independently an integer ranging from 1 to 3.

[Chemical Formula 23a]

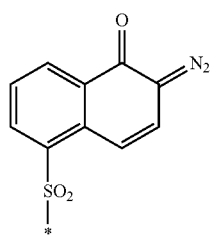

[Chemical Formula 23b]

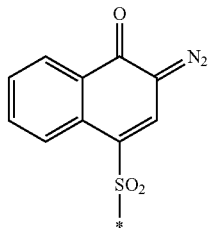

[Chemical Formula 24]

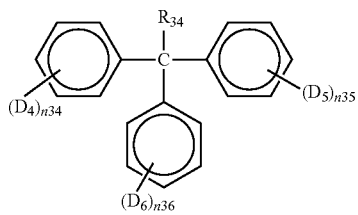

In Chemical Formula 24, $R_{34}$ is hydrogen or substituted or unsubstituted alkyl, $D_4$ to $D_6$ are OQ, wherein Q is the same as defined in Chemical Formula 22, and $n_{34}$ to $n_{36}$ are the same or different and are each independently an integer ranging from 1 to 3.

[Chemical Formula 25]

$(D_9)_{n39}$ — $A_3$ — $(D_7)_{n37}$ / $(D_{10})_{n40}$ — $(D_8)_{n38}$

In Chemical Formula 25, $A_3$ is CO or CRR', wherein R and R' are the same or different and are each independently substituted or unsubstituted alkyl, $D_7$ to $D_{10}$ are the same or different and are each independently hydrogen, substituted or unsubstituted alkyl, OQ, or NHQ, wherein Q is the same as defined in Chemical Formula 22, $n_{37}$, $n_{38}$, $n_{39}$ and $n_{40}$ are the same or different and are each independently an integer ranging from 1 to 4, $n_{37}+n_{38}$ and $n_{39}+n_{40}$ are the same or different and are each independently an integer of less than or equal to 5, provided that at least one of $D_7$ to $D_8$ is OQ, and one aromatic ring includes one to three OQs and the other aromatic ring includes one to four OQs.

[Chemical Formula 26]

$Q-NH-(C)_{n41}(R_{39}/R_{40})-Si(R_{35}/R_{37})-O-Si(R_{36}/R_{38})-(C)_{n42}(R_{41}/R_{42})-NH-Q$

In Chemical Formula 26, $R_{35}$ to $R_{42}$ are the same or different and are each independently hydrogen or a substituted or unsubstituted alkyl, $n_{41}$ and $n_{42}$ are the same or different and are each independently an integer of 1 to 5, for example 2 to 4, and each Q is the same as defined in Chemical Formula 22.

The photosensitive resin composition may include the photosensitive diazoquinone compound in an amount of about 5 to about 100 parts by weight based on about 100 parts by weight of the alkali soluble resin. In some embodiments, the photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of photosensitive diazoquinone compound can be in a range from about any of the foregoing amounts to about any other of the foregoing amounts.

When the amount of the photosensitive diazoquinone compound is within the above range, the pattern can be well-formed with minimal or no residue from exposure, and film thickness loss during development can be minimized or prevented and thereby a good pattern can be provided.

(C) Compound Represented by Chemical Formula 1

The photosensitive resin composition includes a compound represented by the following Chemical Formula 1.

[Chemical Formula 1]

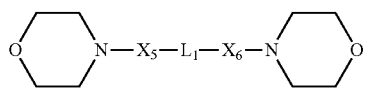

In Chemical Formula 1, $X_5$ and $X_6$ are the same or different and are each independently —S—, —C(=O)—, —C(=S)—, substituted or unsubstituted C1 to C30 alkylene, substituted or unsubstituted C6 to C30 cycloalkylene, or substituted or unsubstituted C6 to C30 arylene, and $L_1$ is a single bond, a disulfide bond (—S—S—), —S(=O)—, —C(=O)—, or —C(=S)—.

In one embodiment, $X_5$ and $X_6$ of the compound represented by the above Chemical Formula 1 are the same or different and are each independently —S—; —C(=O)—; —C(=S)—; substituted or unsubstituted C1 to C30 alkylene such as methylene, ethylene, propylene, isobutylene, and the like; or substituted or unsubstituted C6 to C30 cycloalkylene such as cyclopentylene or cyclohexylene, and $L_1$ is a single bond, a disulfide bond (—S—S—), or —S(=O)—.

In exemplary embodiments, the compound represented by the above Chemical Formula 1 may be a compound represented by one of the following Chemical Formulae 5 to 7, or a combination thereof.

[Chemical Formula 5]

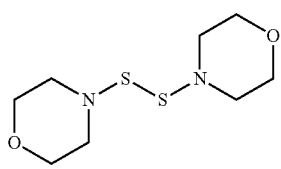

[Chemical Formula 6]

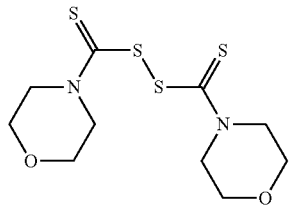

[Chemical Formula 7]

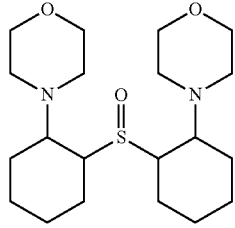

The positive photosensitive resin composition including the compound represented by Chemical Formula 1 can have excellent adherence with a substrate. The conventional silane compound for improving the adherence between the photosensitive resin composition and the substrate can have a high reactivity with both an inorganic filler and an organic polymer, so the compatibility can be deteriorated when added in an excessive amount. However, the compound represented by Chemical Formula 1 can be stable and can have excellent compatibility, so the problems may be avoided even when adding the compound of Chemical Formula 1 in an excessive amount. As a result, the adherence property between a lower substrate and a photosensitive resin layer coated on the same can be significantly improved, which can help reduce defective products.

The positive photosensitive resin composition including the compound represented by the above Chemical Formula 1 uses a coupling agent of dimorpholine derivative to suppress delaminating the metal deposited on the photosensitive resin layer.

The photosensitive resin composition may include the compound represented by the above Chemical Formula 1 in an amount of about 0.1 to about 10 parts by weight, for example 0.5 to 5 parts by weight, based on about 100 parts by weight of the alkali soluble resin. In some embodiments, the photosensitive resin composition may include the compound represented by the above Chemical Formula 1 in an amount of about 0.1, 0.2, 0.3, 0.4, 0.5, 0.6, 0.7, 0.8, 0.9, 1, 2, 3, 4, 5, 6, 7, 8, 9, or 10 parts by weight. Further, according to some embodiments of the present invention, the amount of the compound represented by the above Chemical Formula 1 can be in a range from about any of the foregoing amounts to about any other of the foregoing amounts.

When the photosensitive resin composition includes the compound represented by the above Chemical Formula 1 in an amount in the above range, the photosensitive resin layer may have excellent adherence, and a residual layer may not remain when developing the exposure part.

(D) Solvent

Examples of the solvent may include without limitation N-methyl-2-pyrrolidone, γ-butyrolactone, N,N-dimethyl acetamide, dimethylsulfoxide, diethyleneglycoldimethyl-ether, diethylene glycoldiethylether, diethyleneglycoldibutylether, propyleneglycolmonomethylether, dipropyleneglycolmonomethylether, propyleneglycolmonomethylether acetate, methyl lactate, ethyl lactate, butyl lactate, methyl-1, 3-butyleneglycolacetate, 1,3-butyleneglycol-3-monomethylether, methyl pyruvate, ethyl pyruvate, methyl-3-methoxy propionate, and the like. The solvent may be used singularly or as a mixture of two or more.

The photosensitive resin composition may include solvent in an amount of about 100 to about 400 parts by weight based on about 100 parts by weight of the alkali soluble resin. When the solvent is included in an amount in the above range, a layer of a sufficient thickness may be coated, and solubility and coating properties may be improved.

(E) Silane compound

The photosensitive resin composition may further a silane compound along with the compound represented by the above Chemical Formula 1 to improve adherence with a substrate.

The silane compound may be represented by the following Chemical Formula 27.

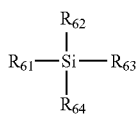

[Chemical Formula 27]

In Chemical Formula 27, $R_{61}$ is a vinyl group, substituted or unsubstituted alkyl, or substituted or unsubstituted aryl, for example 3-(methacryloxy)propyl, p-styryl, or 3-(phenylamino)propyl.

$R_{62}$ to $R_{64}$ are the same or different and are each independently substituted or unsubstituted alkoxy, substituted or unsubstituted alkyl, or halogen, wherein at least one of the $R_{62}$ to $R_{64}$ is alkoxy or halogen, for example the alkoxy may be C1 to C8 alkoxy and the alkyl may be C1 to C20 alkyl.

Other examples of the silane compound may include without limitation compounds represented by the following Chemical Formulae 28 and 29; aryl io group-containing silane compounds such as trimethoxy[3-(phenylamino)propyl]silane and the like; carbon-carbon unsaturated-containing silane compounds such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane, and the like, and combinations thereof. In one embodiment, vinyltrimethoxysilane, or vinyltriethoxysilane may be used.

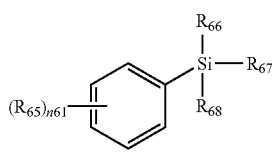

[Chemical Formula 28]

In Chemical Formula 28, $R_{65}$ is $NH_2$ or $CH_3CONH$, $R_{66}$ to $R_{68}$ are the same or different and are each independently substituted or unsubstituted alkoxy, for example $OCH_3$ or $OCH_2CH_3$, and $n_{61}$ is an integer of 1 to 5.

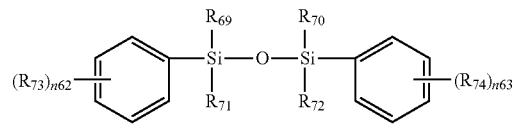

[Chemical Formula 29]

In Chemical Formula 29, $R_{69}$ to $R_{72}$ are the same or different and are each independently substituted or unsubstituted alkyl or substituted or unsubstituted alkoxy, and for example $CH_3$ or $OCH_3$, $R_{73}$ and $R_{74}$ are the same or different and are each independently a substituted or unsubstituted amino group, for example $NH_2$ or $CH_3CONH$, and $n_{62}$ and $n_{63}$ are the same or different and are each independently an integer of 1 to 5.

The photosensitive resin composition may include the silane compound in an amount of about 0.1 to about 30 parts by weight based on about 100 parts by weight of the alkali soluble resin. In some embodiments, the photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the silane compound is included in an amount within the above range, the layer can have excellent adherence to upper and lower layers, minimal or no residue after development, and improved mechanical properties such as optical properties (transmittance) and tensile strengths, elongation rates, Young's modulus, and the like.

(F) Novolac resin

The photosensitive resin composition may further include a novolac resin including a repeating unit represented by the following Chemical Formula 8.

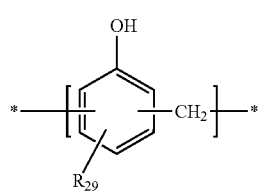

[Chemical Formula 8]

In Chemical Formula 8, $R^{29}$ is the same or different in each repeating unit and is a substituted or unsubstituted C1 to C20 aliphatic organic group, for example substituted or unsubstituted C1 to C20 alkyl.

About 50 mol % or more of $R^{29}$ may be positioned at a meta position based on a position of a hydroxy group (OH), based on the total amount, or 100 mol %, of $R^{29}$ of repeating units of the novolac resin.

When the positive photosensitive resin composition includes the novolac resin, the hydroxy group of the novolac resin can form a hydrogen bond with an alkali water-soluble resin and a photosensitive diazoquinone compound in the non-exposed part, and the $R^{29}$ of the novolac resin can be non-polar, so that the non-exposed part is minimally or not dissolved in the alkali developing solution. On the other hand, the exposed part can exhibit increased polarity by a photo-acid generator of photosensitive diazoquinone compound which can be well dissolved in an alkali developing solution. The non-exposed part is controlled to be non-polar, and the exposed part is controlled to be polar, so the alkali developability, the sensitivity, and the retention rate characteristics can be effectively improved in the exposed part.

In addition, the alkali water-soluble resin can be cross-linked with the novolac resin during thermal curing, so the mechanical strength of a layer obtained by using the positive photosensitive resin composition may be improved, and the residual removing property may be improved.

The novolac resin may play a role of a dissolution controlling agent. The novolac resin may be a random copolymer, a block copolymer, or a combination thereof, but is not limited thereto. In exemplary embodiments, the novolac resin may be a random copolymer.

For example, in the positive photosensitive resin composition, based on a total of 100 mol % of $R^{29}$ present in the repeating unit included in the novolac resin, about 60 mol % or more of $R^{29}$ may be present at a meta position based on a position of the hydroxy group (OH).

As another example, in the positive photosensitive resin composition, based on a total of 100 mol % of $R^{29}$ present in the repeating unit included in the novolac resin, about 90 mol % or more of $R^{29}$ may be present at a meta position and para position based on a position of the hydroxy group (OH). In this case, the repeating unit including $R^{29}$ present in meta position ($R^{29}_m$) and the repeating unit including $R^{29}$ present in para position ($R^{29}_p$) may be random-polymerized or block-polymerized, but is not limited thereto. In this case, the $R^{29}$ present in the meta position ($R^{29}_m$) may improve the alkali developability and the sensitivity in the exposed part, and the $R^{29}$ present in the para position ($R^{29}_p$) may suppress excessive developing in the exposed part and non-exposed part, so the retention rate characteristics may be maintained. Thereby, when using the positive photosensitive resin composition, the alkali developability may be effectively controlled, so the sensitivity and the retention rate characteristic may be improved.

In the repeating unit included in the novolac resin, the $R^{29}$ has a mole ratio of $R^{29}$ present in the meta position ($R^{29}_m$) to $R^{29}$ present in the para position ($R^{29}_p$) with respect to the hydroxy group (OH) of about 5.5 to about 10.0. In this case, the repeating unit including $R^{29}$ present in a meta position ($R^{29}_m$) and the repeating unit including $R^{29}$ present in a para position ($R^{29}_p$) may be random-polymerized or block-polymerized, but is not limited thereto. When $R^{29}$ present in a meta position ($R^{29}_m$) and $R^{29}$ present in a para position ($R^{29}_p$) are present in a mole ratio within the above range, the alkali developability may be effectively controlled when using the positive photosensitive resin composition, and the sensitivity, the retention rate characteristics, and the heat resistance may be effectively improved. For example, the novolac resin may include $R^{29}$ present in a meta position ($R^{29}_m$) and $R^{29}$ present in a para position ($R^{29}_p$) with respect to a hydroxy group (OH) in a mole ratio of about 6:4 to about 9:1.

The novolac resin may further include a compound including a repeating unit represented by the following Chemical Formula 29.

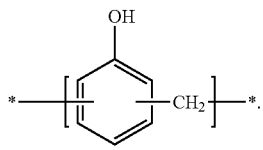

[Chemical Formula 29]

The novolac resin may include a compound including a repeating unit represented by Chemical Formula 8 and a compound including a repeating unit represented by Chemical Formula 29 in a weight ratio of about 30:70 to about 90:10, for example about 40:60 to about 80:20. When the cresol novolac-type repeating unit represented by Chemical Formula 8 and the phenol novolac-type repeating unit represented by Chemical Formula 29 are included in amounts within the above range, the dissolubility to the alkali developing solution may be improved in the exposed part while maintaining the dissolution suppressing property in the non-exposed part, so that the developability in the exposed part may be effectively improved, which can also improve the residual ratio, the sensitivity, and the pattern forming property.

The novolac resin may have a number average molecular weight (Mn) of about 1,000 g/mol to about 10,000 g/mol.

The positive photosensitive resin composition may include the novolac resin in an amount of about 1 part by weight to about 50 parts by weight, for example about 1 part by weight to about 30 parts by weight, and as another example about 2 parts by weight to about 20 parts by weight, based on about 100 parts by weight of the alkali water-soluble resin. In some embodiments, the photosensitive resin composition may include the novolac resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, or 50 parts by weight. Further, according to some embodiments of the present invention, the amount of novolac resin can be in a range from about any of the foregoing amounts to about any other of the foregoing amounts.

When the novolac resin is included in an amount within the above range, the non-exposed part may be effectively controlled to be non-polar; and the exposed part may be effectively controlled to be polar, so that the alkali developability may be effectively improved in the exposed part.

(G) Other Additive(s)

The positive photosensitive resin composition may further include a latent thermal acid generator as an additive. Examples of the latent thermal acid generator may include without limitation arylsulfonic acids such as p-toluene sulfonic acid, benzenesulfonic acids, and the like, perfluoroalkylsulfonic acids such as trifluoromethanesulfonic acid, trifluorobutanesulfonic acid, and the like, alkyl sulfonic acids such as methane sulfonic acid, ethane sulfonic acid, butane sulfonic acid, and the like, and the like, and combinations thereof. The latent thermal acid generator is a catalyst for a dehydration reaction and a cyclization reaction of the polybenzoxazole precursor that is a polyamide including a phenolic hydroxy group, and thus a cyclization reaction may be performed smoothly even if curing temperature is decreased.

In addition, the positive photosensitive resin composition may further include an additive such as a suitable surfactant and/or leveling agent to prevent staining of the layer and/or to improve development.

An exemplary process for forming a pattern using the positive photosensitive resin composition according to one embodiment includes: coating a positive photosensitive resin composition on a supporting substrate; drying the coated positive photosensitive resin composition to provide a positive photosensitive polybenzoxazole precursor layer; exposing the polybenzoxazole precursor layer; developing the exposed polybenzoxazole precursor layer with an alkali aqueous solution to provide a photosensitive resin layer; and baking photosensitive resin layer. The processes of providing a pattern are widely known in this art, so detailed descriptions thereof will be omitted in this specification.

According to another embodiment, an insulation layer prepared using the positive photosensitive resin composition and a display device including the same are provided.

According to another embodiment, a organic light emitting device including the display device is provided. The positive photosensitive resin composition may be used as a surface protective layer and an interlayer insulating layer of a semiconductor device.

The following examples illustrate the present invention in more detail. However, it is understood that the present invention is not limited by these examples.

SYNTHESIS EXAMPLE 1

Synthesis of Polybenzoxazole Precursor (PBO-a)

12.4 g of 2,2-bis(3-amino-4-hydroxyphenyl)-1,1,1,3,3,3-hexafluoropropane and 125 g of N-methyl-2-pyrrolidone (NMP) are put into a four-neck flask mounted with an agitator, a temperature controller, a nitrogen gas injector, and a condenser while nitrogen is passed therethrough and dissolved.

After the solid is completely dissolved, 4.2 g of a catalyst of pyridine is added thereto, and a solution in which 9.4 g of 4,4'-oxydibenzoylchloride is dissolved in 100 g of NMP is slowly dripped into the 4-neck flask for 30 minutes while maintaining a temperature at 0 to 5° C. After completing the drop, the reaction is performed for 1 hour at 0 to 5° C., and the product is heated up to room temperature and then reacted for one hour.

1.1 g of 5-norbornene-2,3-dicarboxyl anhydride is added thereto and agitated at 70° C. for 24 hours, and then the reaction is stopped. The reaction mixture is added to a solution of water/methanol=10/1 (volume ratio) to produce a precipitate, and the precipitate is filtered and fully cleaned with water. Then it is dried at a temperature of 80° C. under a vacuum for greater than or equal to 24 hours to provide a polybenzoxazole precursor.

SYNTHESIS EXAMPLE 2

Synthesis of Polybenzoxazole Precursor (PBO-b)

A polybenzoxazole precursor (PBO-b) is prepared in accordance to the same procedure as in Synthesis Example 1, except that maleic anhydride is used instead of 5-norbornene-2,3-dicarboxyl anhydride.

SYNTHESIS EXAMPLE 3

Synthesis of Polybenzoxazole Precursor (PBO-c)

A polybenzoxazole precursor (PBO-c) is prepared in accordance to the same procedure as in Synthesis Example 1, except that aconitic anhydride is used instead of 5-norbornene-2,3-dicarboxyl anhydride.

EXAMPLE 1

10 g of polybenzoxazole precursor (PBO-a) obtained from Synthesis Example 1 is mixed with 35 g of γ-butyrolactone (GBL) and dissolved, and then 1.4 g of photosensitive diazoquinone having a structure represented by the following Chemical Formula 30 and 0.4 g of 4,4'-dithiodimorpholine represented by the following Chemical Formula 5 are added thereto and dissolved, and then it is filtered with a 0.45 μm filter of fluorine resin to provide a positive photosensitive resin composition.

[Chemical Formula 30]

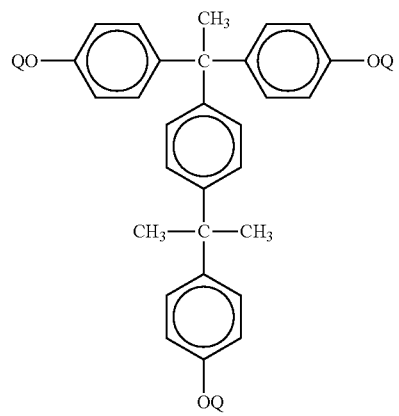

In the above Chemical Formula, two Qs are

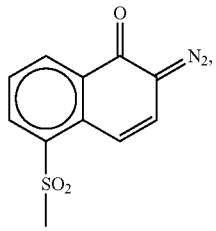

and the remaining one is hydrogen.

[Chemical Formula 5]

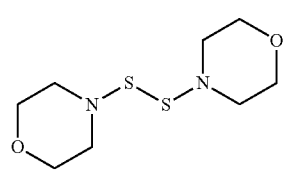

EXAMPLE 2

A positive photosensitive resin composition is prepared in accordance with the same procedure as in Example 1, except that 4,4'-(dithiodicarbonothioyl)dimorpholine represented by the following Chemical Formula 6 is used instead of 4,4'-dithiodimorpholine.

[Chemical Formula 6]

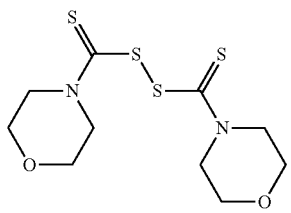

EXAMPLE 3

A positive photosensitive resin composition is prepared in accordance with the same procedure as in Example 1, except that 4,4'-(sulfinyldicyclohexane-2,1-diyl)dimorpholine represented by the following Chemical Formula 7 is used instead of 4,4'-dithiodimorpholine.

[Chemical Formula 7]

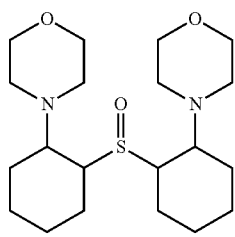

EXAMPLE 4

10 g of polybenzoxazole precursor (PBO-b) obtained from Synthesis Example 2 is mixed with 35 g of γ-butyrolactone (GBL) and dissolved, and then 1.6 g of photosensitive diazoquinone compound represented by Chemical Formula 30 and 0.4 g of 4,4'-dithiodimorpholine represented by Chemical Formula 5 are added as an acid generator and dissolved and filtered with a 0.45 μm filter of fluorine resin to provide a positive photosensitive resin composition.

EXAMPLE 5

A positive photosensitive resin composition is prepared in accordance with the same procedure as in Example 4, except that 4,4'-(dithiodicarbonothioyl)dimorpholine represented by Chemical Formula 6 is used instead of 4,4'-dithiodimorpholine used in Example 4.

EXAMPLE 6

A positive photosensitive resin composition is prepared in accordance with the same procedure as in Example 4, except that 4,4'-(sulfinyldicyclohexane-2,1-diyl)dimorpholine represented by Chemical Formula 7 is used instead of 4,4'-dithiodimorpholine used in Example 4.

EXAMPLE 7

10 g of polybenzoxazole precursor (PBO-c) obtained from Synthesis Example 3 is mixed with 35 g of γ-butyrolactone (GBL) and dissolved, and then 1.6 g of photosensitive diazoquinone compound represented by Chemical Formula 30 and 0.2 g of 4,4'-dithiodimorpholine represented by Chemical Formula 5 are added as an acid generator and dissolved and filtered with a 0.45 μm filter of fluorine resin to provide a positive photosensitive resin composition.

EXAMPLE 8

A positive photosensitive resin composition is prepared in accordance with the same procedure as in Example 7, except that 4,4'-(dithiodicarbonothioyl)dimorpholine represented by Chemical Formula 6 is used instead of 4,4'-dithiodimorpholine used in Example 7.

EXAMPLE 9

A positive photosensitive resin composition is prepared in accordance with the same procedure as in Example 7, except that 4,4'-(sulfinyldicyclohexane-2,1-diyl)dimorpholine represented by Chemical Formula 7 is used instead of 4,4'-dithiodimorpholine used in Example 7.

EXAMPLE 10

A positive photosensitive resin composition is prepared in accordance with the same procedure as in Example 1, except that 0.2 g of 4,4'-dithiodimorpholine and 0.2 g of a silane compound of methyltrimethoxysilane is used instead of 0.4 g of 4,4'-dithiodimorpholine represented by Chemical Formula 5.

EXAMPLE 11

A positive photosensitive resin composition is prepared in accordance with the same procedure as in Example 5, except that 0.2 g of 4,4'-(dithiodicarbonothioyl)dimorpholine and 0.2 g of a silane compound of methyltrimethoxysilane are used instead of 0.4 g of 4,4'-(dithiodicarbonothioyl)dimorpholine represented by Chemical Formula 6 used in Example 5.

EXAMPLE 12

A positive photosensitive resin composition is prepared in accordance with the same procedure as in Example 9, except that 0.2 g of 4,4'-(sulfinyldicyclohexane-2,1-diyl)dimorpholine and 0.2 g of a silane compound of methyltrimethoxysilane are used instead of 0.4 g of 4,4'-(sulfinyldicyclohexane-2,1-diyl)dimorpholine represented by Chemical Formula 7 used in Example 9.

COMPARATIVE EXAMPLE 1

10 g of polybenzoxazole precursor (PBO-a) obtained from Synthesis Example 1 is mixed with 35 g of γ-butyrolactone (GBL) and dissolved, and then 1.4 g of photosensitive diazoquinone compound represented by Chemical Formula 30 is added as an acid generator and dissolved and filtered with a 0.45 μm filter of fluorine resin to provide a positive photosensitive resin composition.

COMPARATIVE EXAMPLE 2

10 g of polybenzoxazole precursor (PBO-a) obtained from Synthesis Example 1 is mixed with 35 g of γ-butyrolactone (GBL) and dissolved, and then 1.4 g of photosensitive diazoquinone compound represented by Chemical Formula 30 and 0.4 g of a silane compound of methyltrimethoxysilane are added as an acid generator and dissolved and filtered with a 0.45 μm filter of fluorine resin to provide a positive photosensitive resin composition.

COMPARATIVE EXAMPLE 3

10 g of polybenzoxazole precursor (PBO-a) obtained from Synthesis Example 1 is mixed with 35 g of γ-butyrolactone (GBL) and dissolved, and then 1.4 g of photosensitive diazoquinone compound represented by Chemical Formula 30 and 0.4 g of silane compound of 2-(3,4-epoxycyclohexyl)ethyltrimethoxysilane are added as an acid generator and dissolved and filtered with a 0.45 μm filter of fluorine resin to provide a positive photosensitive resin composition.

COMPARATIVE EXAMPLE 4

10 g of polybenzoxazole precursor (PBO-a) obtained from Synthesis Example 1 is mixed with 35 g of γ-butyrolactone (GBL) and dissolved, and then 1.4 g of photosensitive diazoquinone compound represented by Chemical Formula 30 and 0.4 g of a silane compound of N-phenylaminopropyltrimethoxysilane are added as an acid generator and dissolved and filtered with a 0.45 μm filter of fluorine resin to provide a positive photosensitive resin composition.

The following Table 1 shows the components and contents of positive photosensitive resin compositions according to Examples 1 to 12 and Comparative Examples 1 to 4.

Silver (Ag) is deposited thereon and then delaminated by a Scotch tape to perform a delaminating test.

In addition, it is allowed to stand for 168 hours under the severe conditions of 85/85 (humidity (%)/temperature (° C.)), and then 3M Scotch tape is applied and detached from the same. An ultrasonic test is conducted using C-Scan equipment to confirm whether silver is delaminated, and the results are shown in FIG. 1. In FIG. 1, the red is the region where silver is delaminated, and the grey is the region where silver remains following the delaminating test.

(2) Die Shear Test

In order to perform an adherence test, each photosensitive resin composition obtained from Examples 1 to 12 and Comparative Examples 1 to 4 is coated on a 8-inch water deposited with silver (Ag) using a spin coater (1H-DX2) manufactured by MIKASA and heated on a hot plate at 130° C. for 2 minutes to provide a photosensitive polyimide film. Then the film formed on a wafer is cured using an electric furnace at 320° C. for 60 minutes to provide a photosensitive resin layer.

Subsequently, it is molded with EMC (epoxy molding compound) and subjected to a Die shear test. When molded with EMC, the molding conditions are soft-baking at 180° C. for 150 seconds and curing at 180° C. for 150 minutes. EMP pin is molded in a cylinder having an exterior diameter of 3 mm and a height of 3.3 mm using a mold, the shear speed is 400 μm/s; and hot stage temperature is 150° C. using a Dage 4000 equipment.

TABLE 1

|  | Polymer (g) |  | Silane compound (g) |  | Compound of Chemical Formula 1 (g) |  |
|---|---|---|---|---|---|---|
| Example 1 | PBO-a | 10 | — | — | 4,4'-dithiodimorpholine | 0.4 |
| Example 2 | PBO-a | 10 | — | — | 4,4'-(dithiodicarbonothioyl)dimorpholine | 0.4 |
| Example 3 | PBO-a | 10 | — | — | 4,4'-(sulfinyldicyclohexane-2,1-diyl)dimorpholine | 0.4 |
| Example 4 | PBO-b | 10 | — | — | 4,4'-dithiodimorpholine | 0.4 |
| Example 5 | PBO-b | 10 | — | — | 4,4'-(dithiodicarbonothioyl)dimorpholine | 0.4 |
| Example 6 | PBO-b | 10 | — | — | 4,4'-(sulfinyldicyclohexane-2,1-diyl)dimorpholine | 0.4 |
| Example 7 | PBO-c | 10 | — | — | 4,4'-dithiodimorpholine | 0.2 |
| Example 8 | PBO-c | 10 | — | — | 4,4'-(dithiodicarbonothioyl)dimorpholine | 0.2 |
| Example 9 | PBO-c | 10 | — | — | 4,4'-(sulfinyldicyclohexane-2,1-diyl)dimorpholine | 0.2 |
| Example 10 | PBO-a | 10 | methyltrimethoxysilane | 0.2 | 4,4'-dithiodimorpholine | 0.2 |
| Example 11 | PBO-b | 10 | methyltrimethoxysilane | 0.2 | 4,4'-(dithiodicarbonothioyl)dimorpholine | 0.2 |
| Example 12 | PBO-c | 10 | methyltrimethoxysilane | 0.2 | 4,4'-(sulfinyldicyclohexane-2,1-diyl)dimorpholine | 0.2 |
| Comparative Example 1 | PBO-a | 10 | — |  | — |  |
| Comparative Example 2 | PBO-a | 10 | methyltrimethoxysilane | 0.4 | — |  |
| Comparative Example 3 | PBO-a | 10 | 2-(3,4-epoxycyclohexyl)ethyltrimethoxysilane | 0.4 | — |  |
| Comparative Example 4 | PBO-a | 10 | N-phenylaminopropyltrimethoxysilane | 0.4 | — |  |

(Physical Property Evaluation: Adherence Test)

(1) Silver (Ag) Depositing and Delaminating Test

Each photosensitive resin composition obtained from Examples 1 to 12 and Comparative Examples 1 to 4 is coated on Dpak and heated on a hot plate at 130° C. for 2 minutes to provide a photosensitive polyimide film. Then the film formed on the wafer is cured at 320° C. for 60 minutes under a nitrogen atmosphere to provide a photosensitive resin film.

TABLE 2

|  | Die shear test (kgf) |
|---|---|
| Example 1 | 13.4 |
| Example 2 | 13.1 |
| Example 3 | 13.4 |
| Example 4 | 13.1 |

TABLE 2-continued

| | Die shear test (kgf) |
|---|---|
| Example 5 | 12.4 |
| Example 6 | 12.6 |
| Example 7 | 13.3 |
| Example 8 | 12.8 |
| Example 9 | 12.1 |
| Example 10 | 13.6 |
| Example 11 | 13.0 |
| Example 12 | 13.3 |
| Comparative Example 1 | 10.6 |
| Comparative Example 2 | 10.2 |
| Comparative Example 3 | 10.8 |
| Comparative Example 4 | 11.2 |

As shown in Table 2, the adherence results of the photosensitive resin layer after being allowed to stand at room temperature shows that, in Examples 1 to 12 including dimorpholine derivative, the deposited Ag is rarely delaminated. In contrast, in the photosensitive resins of Comparative Examples 1 to 4 including no coupling agent or only a silane compound as the coupling agent, almost all of the Ag is delaminated. This means that the photosensitive resin compositions including the dimorpholine compound represented by Chemical Formula 1 have superior adherence with the substrate as compared to the photosensitive resin compositions including no coupling agent or only a silane compound. In addition, under the severe conditions of high humidity and high temperature, the photosensitive resin compositions of Examples 1 to 12 exhibit remarkably superior adherence of the photosensitive resin layer as compared to the positive photosensitive resin compositions of Comparative Example 1 to 4. Particularly, as shown in FIG. 1, it is confirmed that Examples 10 to 12 including 0.2 g of the compound represented by Chemical Formula 1 exhibit superior adherence as compared to Comparative Examples 1 to 4 including 0.4 g of a silane compound.

In addition, the results of measuring the breaking strength of EMP pin in the die shear test show that the positive photosensitive resin compositions according to Examples 1 to 12 exhibit high adherence of greater than or equal to about 13 kgf breaking strength; on the other hand, Comparative Examples 1 to 4 exhibit low breaking strength of about 10 to 11 kgf.

From the results, it is confirmed that the positive photosensitive resin composition including the compound represented by Chemical Formula 1 may provide an insulation layer that can have excellent adherence and a display device including the same.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:
   (A) an alkali soluble resin including a polybenzoxazole precursor, a polyimide precursor, or a combination thereof;
   (B) a photosensitive diazoquinone compound;
   (C) a compound represented by the following Chemical Formula 1; and
   (D) a solvent:

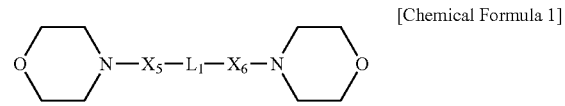

[Chemical Formula 1]

wherein, in Chemical Formula 1,
$X_5$ and $X_6$ are the same or different and are each independently —S—, —C(=O)—, —C(=S)—, substituted or unsubstituted C1 to C30 alkylene, substituted or unsubstituted C6 to C30 cycloalkylene, or substituted or unsubstituted C6 to C30 cycloallylene, and
$L_1$ is a single bond, a disulfide bond (—S—S—), —S(=O)—, —C(=O)—, or —C(=S)—.

2. The positive photosensitive resin composition of claim 1, wherein the polybenzoxazole precursor comprises a repeating unit represented by the following Chemical Formula 2, or repeating units represented by the following Chemical Formulae 2 and 3:

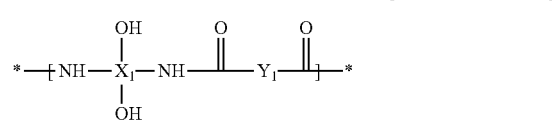

[Chemical Formula 2]

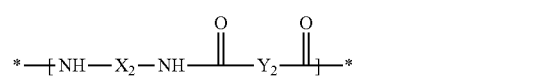

[Chemical Formula 3]

wherein, in Chemical Formulae 2 and 3,
$X_1$ is an aromatic organic group or tetravalent to hexavalent aliphatic organic group,
$Y_1$ and $Y_2$ are the same or different and are each independently an aromatic organic group or divalent to hexavalent aliphatic organic group, and
$X_2$ is an aromatic organic group, divalent to hexavalent aliphatic organic group, divalent to hexavalent alicyclic organic group, or an organic group represented by the following Chemical Formula 4,

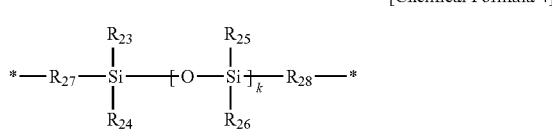

[Chemical Formula 4]

wherein, in Chemical Formula 4,
$R_{23}$ to $R_{26}$ are the same or different and are each independently substituted or unsubstituted alkyl, substituted or unsubstituted aryl, substituted or unsubstituted alkoxy, or hydroxy,
$R_{27}$ and $R_{28}$ are the same or different and are each independently substituted or unsubstituted alkylene or substituted or unsubstituted arylene, and
k is an integer ranging from 1 to 50.

3. The positive photosensitive resin composition of claim 1, wherein the polyimide precursor comprises repeating units represented by the following Chemical Formula 50 and the following Chemical Formula 51:

[Chemical Formula 50]

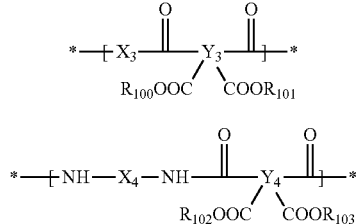

[Chemical Formula 51]

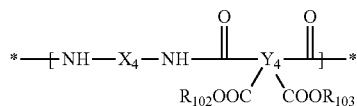

wherein, in Chemical Formulae 50 and 51, $X_3$ is an aromatic organic group or divalent to hexavalent alicyclic organic group, $Y_3$ and $Y_4$ are the same or different and are each independently an aromatic organic group or tetravalent to hexavalent alicyclic organic group, $X_4$ is an aromatic organic group, divalent to hexavalent alicyclic organic group, or a functional group represented by the above Chemical Formula 4, and $R_{100}$ to $R_{103}$ are the same or different and are each independently hydrogen or substituted or unsubstituted C1 to C20 alkyl.

4. The positive photosensitive resin composition of claim 1, wherein the compound represented by the above Chemical Formula 1 comprises one of the compounds represented by the following Chemical Formulae 5 to 7, or a combination thereof:

[Chemical Formula 5]

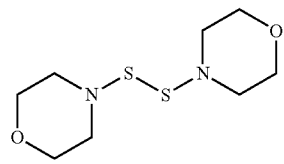

[Chemical Formula 6]

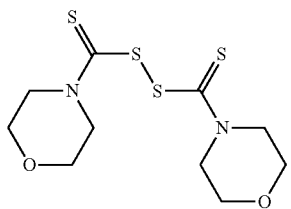

[Chemical Formula 7]

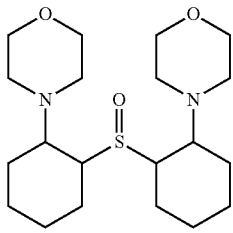

5. The positive photosensitive resin composition of claim 1, wherein the positive photosensitive resin composition further comprise a silane compound.

6. The positive photosensitive resin composition of claim 1, wherein the positive photosensitive resin composition further comprises a novolac resin including a repeating unit represented by the following Chemical Formula 8:

[Chemical Formula 8]

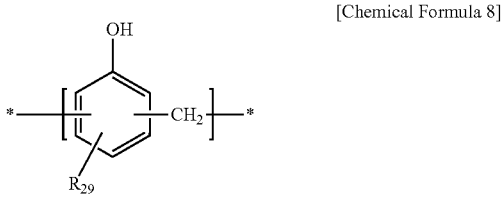

wherein, in Chemical Formula 8, each $R^{29}$ is the same or different in each repeating unit and is each independently a substituted or unsubstituted C1 to C20 aliphatic organic group, wherein about 50 mol % or more of $R^{29}$ is positioned at a meta position relative to a position of a hydroxy group (OH), based on the total amount of $R^{29}$ of the repeating units of the novolac resin.

7. The positive photosensitive resin composition of claim 1, wherein the positive photosensitive resin composition comprises:
about 5 to about 100 parts by weight of a photosensitive diazoquinone compound (B),
about 0.1 to about 10 parts by weight of the compound represented by the above Chemical Formula 1 (C), and
about 100 to about 400 parts by weight of the solvent (E), based on about 100 parts by weight of the alkali soluble resin (A).

8. A display device including an insulation layer prepared using the positive photosensitive resin composition of claim 1.

9. An organic light emitting device using the positive photosensitive resin composition of claim 1.

* * * * *